(12) United States Patent
Kodama

(10) Patent No.: US 8,980,404 B2
(45) Date of Patent: Mar. 17, 2015

(54) COMPOSITION FOR IMPRINTS, PATTERN AND PATTERNING METHOD

(75) Inventor: Kunihiko Kodama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1017 days.

(21) Appl. No.: 13/122,510

(22) PCT Filed: Oct. 29, 2009

(86) PCT No.: PCT/JP2009/068935
§ 371 (c)(1),
(2), (4) Date: Apr. 4, 2011

(87) PCT Pub. No.: WO2010/050614
PCT Pub. Date: May 6, 2010

(65) Prior Publication Data
US 2011/0183127 A1    Jul. 28, 2011

(30) Foreign Application Priority Data

Oct. 29, 2008    (JP) ................................. 2008-278680

(51) Int. Cl.
| | | |
|---|---|---|
| B32B 3/00 | (2006.01) | |
| C08F 259/08 | (2006.01) | |
| B82Y 10/00 | (2011.01) | |
| B82Y 40/00 | (2011.01) | |
| C08F 265/00 | (2006.01) | |
| C08F 265/04 | (2006.01) | |
| C08F 283/12 | (2006.01) | |
| C08L 51/00 | (2006.01) | |
| C09D 183/10 | (2006.01) | |
| G03F 7/00 | (2006.01) | |
| G03F 7/004 | (2006.01) | |
| G03F 7/033 | (2006.01) | |
| G03F 7/075 | (2006.01) | |

(52) U.S. Cl.
CPC .............. *C08F 259/08* (2013.01); *B82Y 10/00* (2013.01); *B82Y 40/00* (2013.01); *C08F 265/00* (2013.01); *C08F 265/04* (2013.01); *C08F 283/12* (2013.01); *C08L 51/003* (2013.01); *C09D 183/10* (2013.01); *G03F 7/0002* (2013.01); *G03F 7/0046* (2013.01); *G03F 7/033* (2013.01); *G03F 7/0758* (2013.01)
USPC ........ 428/195.1; 428/421; 428/522; 428/523; 264/293; 522/99; 522/153; 522/156; 522/150; 526/245; 526/250; 526/279; 526/328.5; 526/329.4

(58) Field of Classification Search
CPC ...... B82Y 10/00; B82Y 40/00; C08F 259/08; C08F 265/04; C08F 283/12; C08L 51/003
USPC ............ 428/64.1, 64.2, 195.1, 421, 522, 523; 522/182, 99, 150, 153, 156; 526/245, 526/246, 250, 279, 328.5, 329.4; 264/293
See application file for complete search history.

(56) References Cited

U.S. PATENT DOCUMENTS

| | | | |
|---|---|---|---|
| 4,884,866 | A | 12/1989 | Hashimoto et al. |
| 5,259,926 | A | 11/1993 | Kuwabara et al. |
| 5,772,905 | A | 6/1998 | Chou |
| 5,956,216 | A | 9/1999 | Chou |
| 8,039,200 | B2 | 10/2011 | Kodama |
| 8,206,886 | B2 | 6/2012 | Kodama |
| 2005/0266336 | A1 | 12/2005 | Kodama |
| 2007/0238317 | A1 | 10/2007 | Allen et al. |
| 2010/0304300 | A1 | 12/2010 | Kodama |

FOREIGN PATENT DOCUMENTS

| | | |
|---|---|---|
| EP | 1 566 692 A1 | 8/2005 |
| EP | 1 722 272 A1 | 11/2006 |
| JP | 2004-240241 A | 8/2004 |
| JP | 2005-084561 A | 3/2005 |
| JP | 2005-197699 A | 7/2005 |
| JP | 2005-221721 A | 8/2005 |
| JP | 2005-301289 A | 10/2005 |
| JP | 2006-310565 A | 11/2006 |
| JP | 2007-001250 A | 1/2007 |
| JP | 2007-178724 A | 7/2007 |
| JP | 2007-210271 A | 8/2007 |
| JP | 2008-084984 A | 4/2008 |
| WO | 2007/133235 A2 | 11/2007 |

OTHER PUBLICATIONS

Machine translation of first part of detailed description of JP 2008-084984 acquired on Aug. 6, 2014.*
International Preliminary Report on Patentability, mailed May 12, 2011, on International Application No. PCT/JP2009/068935.
Office Action dated Nov. 13, 2012 in Japanese Patent Application No. 2008-278680.
Office Action mailed Apr. 8, 2014 in Japanese Application No. 2008-278680.
Office Action dated Aug. 8, 2013 in Japanese Application No. 2008-278680.
Stephen Y. Chou, et al., "Imprint of sub-25 nm vias and trenches in polymers", Appl. Phys. Lett., Nov. 20, 1995, pp. 3114-3116, vol. 67, No. 21.
M. Colburn, et al., "Step and Flash Imprint Lithography: A New Approach to High-Resolution Patterning", Proc. SPIE, Conference on Emerging Lithographic Technologies III, Mar. 1999, pp. 379-389, vol. 3676.
Michael D. Stewart, et al., "Imprint Materials for Nanoscale Devices", MRS Bulletin, Dec. 2005, pp. 947-951, vol. 30, No. 12.

* cited by examiner

*Primary Examiner* — Gerard Higgins
(74) *Attorney, Agent, or Firm* — Sughrue Mion, PLLC

(57) ABSTRACT

A composition for imprints comprising a polymerizable monomer, a photopolymerization initiator, and a polymer having a functional group with at least one of a fluorine atom or a silicon atom and having a polymerizable functional group, wherein the polymer has a weight-average molecular weight of at least 2000 and the amount of the polymer is from 0.01 to 20% by mass relative to the polymerizable monomer, is excellent in patternability and mold releasability, capable of forming good patterns and free from a problem of mold contamination.

21 Claims, No Drawings

COMPOSITION FOR IMPRINTS, PATTERN AND PATTERNING METHOD

CROSS REFERENCE TO RELATED APPLICATION

This is a National Stage of International Application No. PCT/JP2009/068935 filed Oct. 29, 2009, claiming priority based on Japanese Patent Application No. 2008-278680 filed Oct. 29, 2008, the contents of all of which are incorporated herein by reference in their entirety.

TECHNICAL FIELD

The present invention relates to a composition for imprints. More precisely, the invention relates to a composition for micropatterning to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

BACKGROUND ART

Imprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photocurable composition (for example, see M. Colbun, et al., Proc. SPIE, Vol. 3676, 379 (1999)). In the thermal imprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose an imprint method of forming nanopatterns inexpensively.

On the other hand, in the photoimprint method where a composition for photoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the imprint methods as above, proposed are applied technologies to nano-scale mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned imprint technologies and their applied technologies has become active for practical use thereof.

As one example of imprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, imprint lithography, particularly nanoimprint lithography is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of imprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of imprint technology is proposed. The application also requires micropatternability on a level of a few tens nm and high-level etching resistance of the micropattern functioning as a mask in substrate processing.

Next described is an application example of imprint technology to flat displays such as liquid-crystal displays (LCD) and plasma display panels (PDP).

With the recent tendency toward large-sized LCD substrates and PDP substrates for high-definition microprocessing thereon, photoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 μm or 20 μm or so is formed through photolithography, and this is further thermally cured through past-baking to form the intended spacer.

Further, imprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in imprint technology, which is therefore specifically noted as a technology capable of forming micropatterns inexpensively.

It is an assumption that these applications form a good pattern, however, with regard to the photoimprint method in the patterning, it is necessary for the composition to be sufficiently charged in a mold, and the liquid curable composition for use in the photoimprint method is required to have a low viscosity. On the other hand, in the thermal imprint method, a mold is pressed against the resin composition softened by high-pressure heating to charge the resin composition into the mold. At this time, the thermal flowability of the resin composition has an effect. Further, in addition to the factors above, various factors such as the friction between the mold and the composition, the affinity of the composition with the mold, the mold-pressing pressure, and the like affect the patternability, and accordingly, a clear guideline for forming a good pattern is not available at present.

Another important parameter in imprint technology for micropatterning is the peelability of the composition for imprints from molds. Different from photolithography in which a photosensitive composition is not kept in contact with a mask, a composition for imprints is kept in contact with the mold in imprint technology. In peeling from the mold, when the residue of the composition remains on the mold, there occurs a problem in that the residue may form pattern failures in the subsequent imprinting procedure. For solving the problem, some trials have heretofore been taken for mold surface treatment. Concretely, a method of bonding a fluoroalkyl chain-containing silane coupling agent to a mold surface, or a method of using a fluorine/plasma-processed mold or a fluorine-containing resin mold has been tried for solving the residue deposition problem. However, in industrial-scale mass production, the mold to be used is required to be resistant to tens of thousands of times of imprinting repetition; and not only the mold surface treatment but also the mold releasability improvement of the compositions for imprints is required.

Above all, these days it has become considered as important to improve the mold releasability, and for example, M. Stewart et al.: MRS Bulletin, Vol. 30, No. 12, 947 (2005) discloses a photocurable composition containing a monofunctional acrylic monomer, a bifunctional acrylic monomer, a silicon-having monofunctional acrylic monomer and a photopolymerization initiator, as a means for enhancing the mold releasability of a photocurable resin and for solving the problem of shrinkage of cured films and the problem of sensitivity reduction owing to interference with photopolymerization in the presence of oxygen. JP-A 2005-084561, JP-A 2007-001250 and JP-A 2006-310565 disclose compositions for imprints containing a silicone oil and a fluoropolymer with no polymerizable group. As containing a silicone oil and a fluoropolymer, these compositions could be improved in point of the patternability and the mold releasability thereof, but have a problem in that, in repeated pattern transfer operation, the silicone oil and the fluoropolymer adheres to the mold surface to foul the mold.

In fact, in addition, no detailed investigations have been made in the art about what type of a fluoropolymer or a fluorine compound could contribute toward enhancing the mold releasability and how much of such a polymer or a compound could be added to a composition for imprints.

SUMMARY OF THE INVENTION

The present inventors have investigated the compositions for imprints described in Patent References 8 to 10, and have known that their mold releasability is insufficient or even though their mold releasability could be enhanced, their line edge roughness may increase.

An object of the present invention is to provide a composition for imprints excellent in mold releasability, capable of forming good patterns and free from a problem of mold contamination, a pattern using the composition, and a method for forming the pattern.

The present inventors have found that when a fluoropolymer having a specific structure is incorporated into a composition for imprints to exist in a specific ratio therein, then the resulting composition for imprints of the invention is excellent in mold releasability and forms good patterns and is free from a problem of mold contamination. Specifically, the invention is as follows:

[1] A composition for imprints comprising a polymerizable monomer, a photopolymerization initiator, and a polymer having a functional group with at least one of a fluorine atom or a silicon atom and having a polymerizable functional group, wherein the polymer has a weight-average molecular weight of at least 2000 and the amount of the polymer is from 0.01 to 20% by mass relative to the polymerizable monomer.

[2] The composition for imprints according to [1], wherein the polymer has both the functional group with at least one of a fluorine atom or a silicon atom and the polymerizable functional group in a side branch of the polymer.

[3] The composition for imprints according to [1] or [2], wherein the functional group with at least one of a fluorine atom or a silicon atom has at least one structure selected from the group consisting of a trifluoromethyl group, a trimethylsilyl group and a dimethylsiloxane structure-having group

[4] The composition for imprints according to any one of [1] to [3], wherein the polymerizable functional group is a (meth)acrylate group.

[5] The composition for imprints according to any one of [1] to [4], wherein the polymer is a (meth)acrylate polymer.

[6] The composition for imprints according to any one of [1] to [5], wherein the polymer has, in a side branch thereof, a recurring unit having an aromatic group, an acyclic alkyl group having at least 4 carbon atoms or a cyclic alkyl group having at least 6 carbon atoms.

[7] The composition for imprints according to any one of [1] to [6], wherein the polymer has a degree of dispersion of from 1.0 to 4.0.

[8] The composition for imprints according to any one of [1] to [7], wherein the polymerizable monomer has a (meth)acrylate structure having an aromatic group, an acyclic alkyl group having at least 4 carbon atoms or a cyclic alkyl group having at least 6 carbon atoms.

[9] The composition for imprints according to any one of [1] to [8], which further comprises a solvent.

[10] The composition for imprints according to [9], wherein the solvent has at least one selected from the group consisting of an ester group, an ether group, a carbonyl group and a hydroxyl group.

[11] The composition for imprints according to any one of [1] to [10], which further comprises a nonionic surfactant.

[12] A patterning method comprising applying the composition for imprints of any one of [1] to [10] onto a substrate to form a patterning layer thereon, and pressing a mold against the surface of the patterning layer.

[13] A pattern formed according to the patterning method of [12].

According to the invention, there is provided a composition for imprints excellent in patternability and mold releasability, capable of forming good patterns and free from a problem of mold contamination. According to the patterning method of the invention, there is provided the pattern of the invention faithful to the mold with no line pattern defect.

MODES FOR CARRYING OUT THE INVENTION

The contents of the invention are described in detail hereinunder. In this specification, the numerical range expressed by the wording "a number to another number" means the range that falls between the former number indicating the lowermost limit of the range and the latter number indicating the uppermost limit thereof. In this specification, mass ratio is equal to weight ratio.

In this specification, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this specification, "functional group" means a group participating in polymerization.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this specification, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Composition for Imprints of the Invention]

One embodiment of the composition for imprints of the invention (hereinafter this may be simply referred to as "the composition of the invention") is a (photo)imprint composition comprising (A) a polymerizable monomer, (B) a photopolymerization initiator, and (C) a polymer having a functional group with at least one of a fluorine atom or a silicon atom and having a polymerizable functional group (hereinafter this may be referred to as "ingredient (C)"), wherein the polymer having a functional group with at least one of a fluorine atom or a silicon atom and having a polymerizable functional group has a weight-average molecular weight of at least 2000 and the amount of the polymer having a functional group with at least one of a fluorine atom or a silicon atom and having a polymerizable functional group is from 0.01 to 20% by mass relative to the polymerizable monomer (hereinafter this may be referred to as "curable photoimprint composition"). In general, a curable composition for use in a photoimprinting method comprises a polymerizable monomer having a polymerizable functional group, and a photopolymerization initiator to initiate the polymerization of the polymerizable monomer through irradiation with light, and optionally contains a solvent, a surfactant or an antioxidant, etc. In the invention, the composition further contains the above-mentioned ingredient (C) having a specific molecular weight.

<Polymerizable Monomer (A)>

The polymerizable monomers which can be preferably used in the invention include, for example, a polymerizable unsaturated monomer having from 1 to 6 ethylenic unsaturated bond-having groups, a compound having an oxirane ring (epoxy compound), a vinyl ether compound, a styrene derivative, a fluorine atom-having compound, propenyl ether, butenyl ether, etc. From the viewpoint of the curability of the composition, more preferred is a polymerizable unsaturated monomer having from 1 to 6 ethylenic unsaturated bond-having groups.

The polymerizable unsaturated monomer having from 1 to ethylenic unsaturated bond-having groups (mono- to hexafunctional polymerizable unsaturated monomer) is described below.

The polymerizable unsaturated monomer having one ethylenic unsaturated bond-having group (mono-functional polymerizable unsaturated monomer) includes concretely 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol (meth)acrylate, 2-hydroxybutyl(meth)acrylate, 2-hydroxyethyl(meth)acrylate, 2-hydroxypropyl (meth)acrylate, 2-methoxyethyl(meth)acrylate, 3-methoxybutyl(meth)acrylate, 4-hydroxybutyl(meth)acrylate, acrylic acid dimer, benzyl(meth)acrylate, 1- or 2-naphthyl (meta)acrylate, butanediol mono(meth)acrylate, butoxyethyl (meth)acrylate, butyl (meth)acrylate, cetyl(meth)acrylate, ethyleneoxide-modified (hereinafter this maybe referred to as "EO") cresol (meth)acrylate, dipropylene glycol (meth)acrylate, ethoxylated phenyl(meth)acrylate, ethyl (meth)acrylate, isoamyl(meth)acrylate, isobutyl (meth)acrylate, isooctyl(meth)acrylate, cyclohexyl (meth)acrylate, isobornyl(meth)acrylate, dicyclopentanyl (meth)acrylate, dicyclopentanyloxyethyl(meth)acrylate, isomyristyl(meth)acrylate, lauryl(meth)acrylate, methoxydiproylene glycol (meth)acrylate, methoxytripropylene glycol (meth)acrylate, methoxypolyethylene glycol (meth)acrylate, methoxytriethylene glycol (meth)acrylate, methyl(meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl(meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl(meth)acrylate, EO-modified succinic acid (meth)acrylate, tert-butyl (meth)acrylate, tribromophenyl(meth)acrylate, EO-modified tribromophenyl(meth)acrylate, tridodecyl(meth)acrylate, p-isopropenylphenol, styrene, α-methylstyrene, acrylonitrile.

Of those, in view of dry etching resistance, especially preferred are (meth)acrylates having an aromatic group or an acyclic hydrocarbon group. Preferred for use in the invention are benzyl(meth)acrylate, 1- or 2-naphthyl(meta) acrylate, 1- or 2-naphthylmethyl(meth)acrylate, dicyclopentanyl (meth)acrylate, dicyclopentanyloxyethyl(meth)acrylate, isobornyl (meth)acrylate, adamantyl(meth)acrylate.

As the other polymerizable monomer, also preferred is a polyfunctional polymerizable unsaturated monomer having two ethylenic unsaturated bond-containing groups.

Preferred examples of the difunctional polymerizable unsaturated monomer having two ethylenic unsaturated bond-containing groups for use in the invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecanedi(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea.

Of those, especially preferred for use in the invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, etc.

Examples of the polyfunctional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra(meth)acrylate, pentaerythritol tetra(meth)acrylate, etc.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-having compound (epoxy compound) preferred for use in the invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, Epikote CT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable monomer for use in the invention, vinyl ether compounds may be in the composition.

Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

For the purpose of enhancing the releasability from mold and the coatability of the composition, a fluorine atom-having compound may be incorporated into the composition. The compound includes, for example, trifluoromethyl (meth) acrylate, pentafluoroethyl(meth)acrylate, (perfluorobutyl) ethyl(meth)acrylate, perfluorobutyl-hydroxypropyl(meth) acrylate, (perfluorohexyl)ethyl(meth)acrylate, octafluoropentyl (meth)acrylate, perfluorooctylethyl(meth) acrylate, tetrafluoropropyl(meth)acrylate, etc.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, propenyl ether propylene carbonate, etc.

In the composition for imprints of the invention, (meth) acrylate group is preferable and acrylate group is more preferable as a polymerizable functional group.

More desirably, the polymerizable monomer as described above is contained, for example, in a range of from 70 to 99.9% by mass, preferably from 80 to 99.5% by mass, and more preferably from 90 to 99.5% by mass, of the total composition except the solvent of the invention.

A monofunctional polymerizable monomer is generally used as a reactive diluent, and has an effect of lowering the viscosity of the composition for imprints of the invention, and it is preferably added in an amount of at least 15% by mass, more preferably from 20 to 80% by mass, even more preferably from 25 to 70% by mass, and particularly preferably from 30 to 60% by mass, relative to the total amount of the polymerizable monomers.

A monomer having two unsaturated bond-having groups (difunctional polymerizable unsaturated monomer) is added in an amount of preferably at most 90% by mass, more preferably at most 80% by mass, and particularly preferably at most 70% by mass, of all the polymerizable unsaturated monomers. The proportion of the monofunctional and difunctional polymerizable unsaturated monomers to be added is preferably from 10 to 100% by mass, more preferably from 30 to 95% by mass, and particularly preferably from 50 to 90% by mass, of all the polymerizable unsaturated monomers. The proportion of the polyfunctional polymerizable unsaturated monomer having three or more unsaturated bond-having groups is preferably at most 80% by mass, more preferably at most 60% by mass, and particularly preferably at most 40% by mass, of all the polymerizable unsaturated monomers. When the proportion of the polymerizable unsaturated monomer having three or more polymerizable unsaturated bond-having groups is at 80% by mass or less, the viscosity of the composition can be lowered, thereby it becoming preferable.

The polymerizable monomer in the invention preferably contains a (meth)acrylate compound having an aromatic group and/or an acyclic alkyl group having at least 4 carbon atoms and/or a cyclic alkyl group having at least 6 carbon atoms. In case where the polymerizable monomer contains a (meth)acrylate compound having an aromatic group and/or an acyclic alkyl group having at least 4 carbon atoms and/or a cyclic alkyl group having at least 6 carbon atoms, the line edge roughness of the pattern formed by etching may be reduced more.

Preferably, the polymerizable monomer has from 1 to 3 polymerizable groups, more preferably one polymerizable group.

Preferably, the total content of the polymerizable monomers having an urethane group, a hydroxyl group or an amide group in the composition of the invention is at most 20% by mass of all the polymerizable monomers therein. In case where the composition contains polymerizable monomers having an urethane group, a hydroxyl group or an amide group in a total amount of at most 20% by mass, the composition may have better patternability and the line edge roughness of the pattern formed by etching may be reduced more.

Preferably, the polymerizable monomers in the invention are so controlled that the content of a polymerizable monomer with no fluorine atom is from 90 to 100% by mass of all the polymerizable monomers. When the composition contains a polymerizable monomer with no fluorine atom in a larger amount, the dry etching resistance of the composition may be bettered and the line edge roughness of the pattern formed by dry etching may be reduced more.

<Photopolymerization initiator (B)>

The composition for imprints of the invention comprises a photopolymerization initiator. As the photopolymerization initiator in the invention, usable is any compound capable of generating an active radical for polymerization of the above-mentioned polymerizable monomer through photoirradiation. As the photopolymerization initiator, preferred are radical polymerization initiators. In the invention, two or more different types of photopolymerization initiators may be used, as combined.

The content of the photopolymerization initiator may be, for example, from 0.01 to 15% by mass of all the components constituting the composition except solvent, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better. Heretofore, inkjet compositions and compositions for liquid-crystal display color filters containing dye and/or pigments have been variously investigated in point of the preferred amount of the photopolymerization initiator and/or the photoacid generator to be in the compositions; however, there is no report relating to the preferred amount of the photopolymerization initiator and/or the photoacid generator to be added to photocurable compositions for imprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the composition for imprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are acylphosphine oxide compounds and oxime ester compounds from the viewpoint of the curing sensitivity and the absorption characteristics of the composition. As the photopolymerization initiator, for example, commercial products may be used. Their examples are Irgacure® 2959 (1-[4-(2-hydroxyethoxy)phenyl]-2-hydroxy-2-methyl-1-propan-1-one), Irgacure® 184 (1-hydroxycyclohexyl phenyl ketone), Irgacure® 500 (1-hydroxycyclohexyl phenyl ketone, benzophenone), Irgacure® 651 (2,2-dimethoxy-1,2-diphenylethan-1-one), Irgacure® 369 (2-benzyl-2-dimethylamino-1-(4-morpholinophenyl)butanone-1), Irgacure® 907 (2-methyl-1[4-methylthiophenyl]-2-morpholinopropan-1-one), Irgacure® 819 (bis(2,4,6-trimethylbenzoyl)-phenylphosphine oxide), Irgacure® 1800 (bis(2,6-dimethoxybenzoyl)-2,4,4-trimethylpentylphosphine oxide, 1-hydroxycyclohexyl phenyl ketone), Irgacure® 1800 (bis(2,6-dimethoxybenzoyl)-2,4,4-trimethylpentylphosphine oxide, 2-hydroxy-2-methyl-1-phenyl-1-propan-1-one), Irgacure® OXE01 (1,2-octanedione, 1-[4-(phenylthio)phenyl]-2-(O-benzoyloxime)), Darocur® 1173 (2-hydroxy-2-methyl-1-phenyl-1-propan-1-one), Darocur® 1116, 1398, 1174 and 1020, CGI242 (ethanone, 1-[9-ethyl-6-(2-methylbenzoyl)-9H-carbazol-3-yl]-1-(O-acety loxime)), which are all available from Ciba; Lucirin TPO (2,4,6-trimethylbenzoyl-diphenylphosphine oxide), Lucirin TPO-L (2,4,6-trimethylbenzoylphenylethoxyphosphine oxide) which are both available from BASF; Esacure 1001M (1-[4-benzoylphenylsulfanyl]phenyl)-2-methyl-2-(4-methylphenylsulfonyl)propan-1-one available from Nihon SiberHegner; Adeka Optomer® N-1414 (carbazole/phenone compound), Adeka Optomer® N-1717 (acridine compound), Adeka Optomer® N-1606 (triazine compound), all available from Asahi Denka; Sanwa Chemical's TFE-triazine (2-[2-(furan-2-yl)vinyl]-4,6-bis(trichloromethyl)-1,3,5-tri azine), Sanwa Chemical's TME-triazine (2-[2-(5-methylfuran-2-yl)vinyl]-4,6-bis(trichloromethyl)-1,3,5-triazine), Sanwa Chemical's MP-triazine (2-(4-methoxyphenyl)-4,6-bis(trichloromethyl)-1,3,5-triazin e); Midori Chemical's TAZ-113 (2-[2-(3,4-dimethoxyphenyl)ethenyl]-4,6-bis(trichloromethyl)-1,3,5-triazine), Midori Chemical's TAZ-108 (2-(3,4-dimethoxyphenyl)-4,6-bis(trichloromethyl)-1,3,5-tri azine; as well as benzophenone, 4,4'-bisdiethylaminobenzophenone, methyl-2-benzophenone, 4-benzoyl-4'-methyl-diphenyl sulfide, 4-phenylbenzophenone, ethyl Michler's ketone, 2-chlorothioxanthone, 2-methylthioxanthone, 2-isopropylthioxanthone, 4-isopropylthioxanthone, 2,4-diethylthioxanthone, 1-chloro-4-propoxythioxanthone, 2-methylthioxanthone, thioxanthone ammonium salt, benzoin, 4,4'-dimethoxybenzoin, benzoin methyl ether, benzoin ethyl ether, benzoin isopropyl ether, benzoin isobutyl ether, benzyl dimethyl ketal, 1,1,1-trichloroacetophenone, diethoxyacetophenone, dibenzosuberone, methyl o-benzoylbenzoate, 2-benzoylnaphthalene, 4-benzoylbiphenyl, 4-benzoyldiphenyl ether, 1,4-benzoylbenzene, benzil, 10-butyl-2-chloroacridone, [4-(methylphenylthio)phenyl]phenylmethane), 2-ethylanthraquinone, 2,2-bis(2-chlorophenyl)-4,5,4',5'-tetrakis(3,4,5-trimethoxy phenyl)-1,2'-biimidazole, 2,2-bis(o-chlorophenyl)-4,5,4',5'-tetraphenyl-1,2'-biimidazole, tris(4-dimethylaminophenyl)methane, ethyl 4-(dimethylamino) benzoate, 2-(dimethylamino)ethyl benzoate, butoxyethyl 4-(dimethylamino)benzoate, etc.

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

The photopolymerization initiator in the invention must be suitably selected depending on the wavelength of the light source used; and preferred are those not generating gas during mold compression and photoexposure. Gas generation, if any, may cause mold contamination, therefore giving problems in that the mold must be washed frequently and the photocurable composition may be deformed in the mold and the transferred pattern accuracy may be thereby worsened.

The composition for imprints of the invention is preferably a radical-polymerizable composition, in which the polymerizable monomer (A) is a radical-polymerizable monomer and the photopolymerization initiator (B) is a radical polymerization initiator that generates a radical through photoirradiation.

<(C) Polymer Having a Functional Group with at Least One of a Fluorine Atom or a Silicon Atom and Having a Polymerizable Functional Group>

The curable composition for imprints of the invention contains a polymer having a functional group with at least one of a fluorine atom or a silicon atom and having a polymerizable functional group (hereinafter this may be referred to as "polymer (C)"), in which the polymer has a weight-average molecular weight of at least 2000 and the content of the polymer is from 0.01 to 20% by mass relative to the polymerizable monomer in the composition.

The polymer (C) having a functional group with at least one of a fluorine atom or a silicon atom and having a polymerizable functional group has a functional group with a fluorine atom and/or a silicon atom. As having a functional group with at least one of a fluorine atom or a silicon atom, the polymer may be eccentrically localized in the interface that is in contact with a mold, and is effective even when its amount is small, and brings about a favorable effect of improved mold releasability not detracting from the physical properties of the cured film.

In the composition for imprints of the invention, the functional group with at least one of a fluorine atom or a silicon atom preferably has at least one structure selected from a trifluoromethyl group, a trimethylsilyl group and a dimethylsiloxane structure-having group, from the viewpoint of the mold releasability of the composition and the miscibility of the polymer with the other ingredients constituting the composition.

—Functional Group with Fluorine Atom—

The functional group having a fluorine atom preferably has a fluoroalkyl group or a fluoroalkyl-ether group, more preferably a trifluoromethyl group from the viewpoint of the interface eccentric localizability of the polymer.

The polymer (C) preferably contains a recurring unit having a trifluoromethyl group. The recurring unit having a trifluoromethyl group may have any structure having a trifluoromethyl group, and for example, it may have a trifluoromethyl group in the terminal of a fluoroalkyl chain having at least 2 carbon atoms, or a trifluoromethyl group may directly bond to the recurring unit with no fluoroalkyl chain therebetween. The fluoroalkyl group may have a hetero atom such as an oxygen atom or the like as a linking group in the fluoroalkyl chain.

The functional group having a trifluoromethyl group includes a trifluoromethyl group, a pentafluoroethyl group, a heptafluoropropyl group, a hexafluoroisopropyl group, a nonafluorobutyl group, a tridecafluorohexyl group, a heptadecafluorooctyl group, etc.

The recurring unit having a trifluoromethyl group is more preferably a recurring unit having at least two trifluoromethyl groups therein, even more preferably 2 or 3 trifluoromethyl groups therein, still more preferably two trifluoromethyl groups therein.

In the recurring unit having a trifluoromethyl group, preferably, the proportion of the trifluoromethyl group in the recurring unit, especially the proportion of the trifluoromethyl group in the fluoroalkyl chain, if any, in the recurring unit is increased and the fluorine atom content of the polymer is reduced, whereby the line edge roughness after dry etching may be reduced. Concretely, the recurring unit having a trifluoromethyl group preferably satisfies the following formula (1):

$$[\text{Number of trifluoromethyl groups in recurring unit/number of all fluorine atoms in recurring unit}] \geq 0.1 \quad (1)$$

In case where the polymer satisfies the above formula (1), the line edge roughness after dry etching may be reduced more. More preferably, the left-hand value of the formula (1) is at least 0.14, even more preferably at least 0.2, most preferably at least 0.3.

Preferably, the fluorine content of the polymer (C) is at most 60%, more preferably at most 50%, even more preferably at most 40%, most preferably at most 30%.

Reducing the fluorine content results in reduction in the line edge roughness after dry etching. In the invention, the fluorine content is as follows: The fluorine content of each recurring unit of the polymer is computed according to the following formula (2), and the resulting value is multiplied by the copolymerization ratio by weight of the individual recurring unit, and all the data are summed up.

$$(\text{Fluorine content of recurring unit}) = [(\text{atomic weight of fluorine atom}) \times (\text{number of fluorine atoms}) / (\text{molecular weight of recurring unit})] \times 100 \quad (2)$$

Preferred examples of the recurring unit having a trifluoromethyl group are those of the following formulae (Ca) to (Cf):

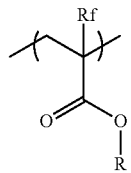

(Ca)

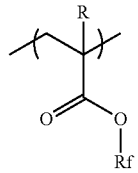

(Cb)

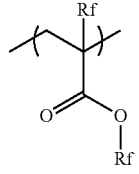

(Cc)

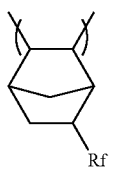
(Cd)

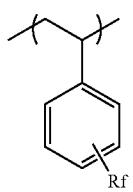
(Ce)

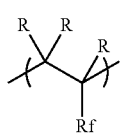
(Cf)

In the above-mentioned recurring units of (Ca) to (Cf), Rf represents a functional group having at least one trifluoromethyl group, R represents a hydrogen atom or an organic group. In case where R is an organic group, the organic group is preferably an alkyl group having from 1 to 4 carbon atoms, or a halogen atom.

The recurring unit having a functional group with a fluorine atom includes the following:

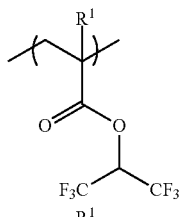
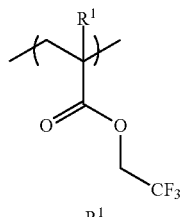
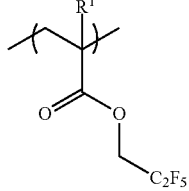
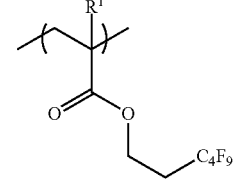
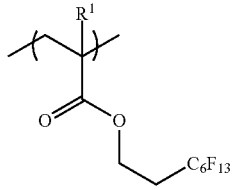
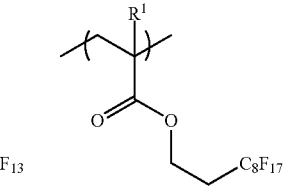
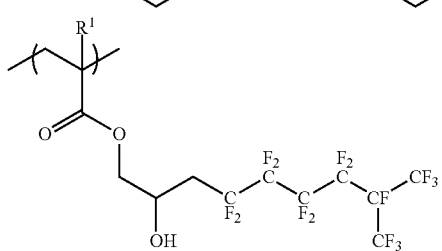
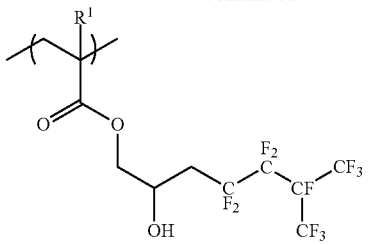
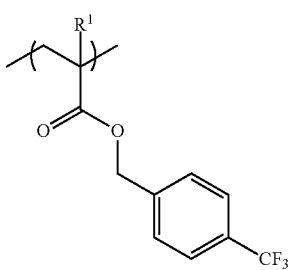
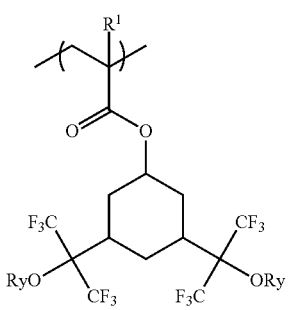
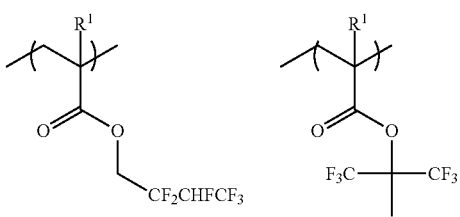
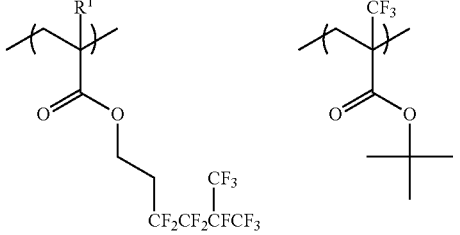
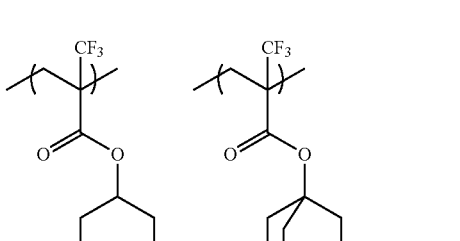

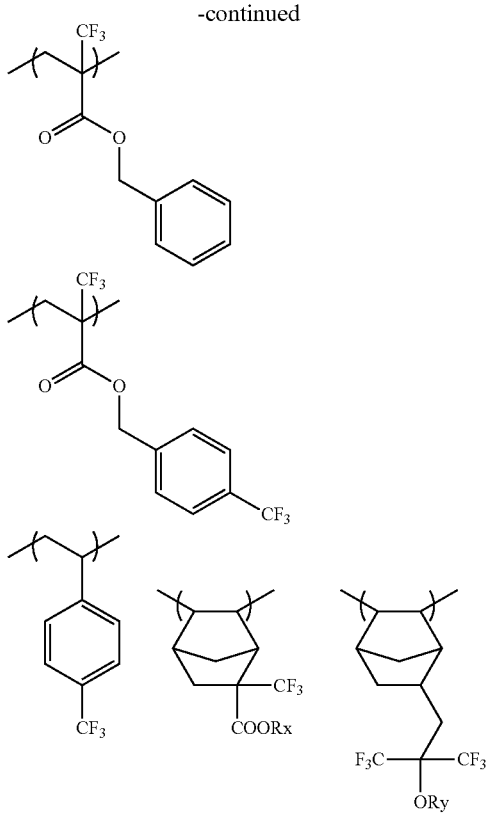

In the structure of the recurring unit having a functional group with a fluorine atom, $R^1$ represents a hydrogen atom, a halogen atom, a methyl group or a cyano group; and $R^1$ is preferably a hydrogen atom or a methyl group.

Rx and Ry each independently represent a hydrogen atom, an alkyl group, an aryl group, or an aralkyl group.

—Functional Group with Silicon Atom—

The functional group with a silicon atom includes a trialkylsilyl group, a linear siloxane structure, a cyclic siloxane structure, a cage-like siloxane structure, etc. Preferred is a functional group having a trimethylsilyl group or a dimethylsiloxane structure from the viewpoint of the mold releasability of the composition.

Preferably, the polymer (C) has a recurring unit having a trimethylsilyl group, or a recurring unit having a dimethylsiloxane structure-having group.

The recurring unit having a trimethylsilyl group may have any structure having a trimethylsilyl group, for example, a structure with a trimethylsilyl group directly bonding to the main chain of the polymer (C), or a structure with a trimethylsilyl group bonding to the main chain via a linking group therebetween. The linking group includes an alkylene group, an ester bond such as —OCO—, an ether bond, an arylene group, or a linking group of a plurality of those groups. A trimethylsilyl group may bond to the terminal of a dimethylsiloxane structure constituting the recurring unit.

Preferably, the trimethylsilyl group-having recurring unit has from 1 to 5 trimethylsilyl groups therein, more preferably from 1 to 3 trimethylsilyl groups therein.

In the (meth)acrylate polymer having a trimethylsilyl group-having recurring unit, the silicon atom content is not specifically defined but is preferably at least 5%, more preferably from 5 to 30%.

The silicon atom content is as follows: The silicon atom content of each recurring unit is computed according to the following formula, the resulting value is multiplied by the copolymerization ratio by weight of the individual recurring unit, and all the data are summed up.

(Silicon atom content of recurring unit)=[(number of silicon atoms)×(atomic weight of silicon atom)/ (molecular weight of recurring unit)]

The recurring unit having a dimethylsiloxane structure-having group may have any structure having a dimethylsiloxane structure-having group, for example, a structure with a methylsiloxane structure-having group directly bonding to the main chain of the polymer (C), or a structure with a methylsiloxane structure-having group bonding to the main chain via a linking group therebetween; or the main chain of the polymer (C) may have a methylsiloxane structure-having group. The linking group includes an alkylene group, an ester bond such as —OCO—, an ether bond, an arylene group, or a linking group of a plurality of those groups.

Preferably, in the recurring unit having a dimethylsiloxane structure-having group, the number of the recurring units of a dimethylsiloxane structure is preferably from 3 to 100, more preferably from 5 to 50, even more preferably from 5 to 20.

In the (meth)acrylate polymer having a recurring unit with a dimethylsiloxane structure, the silicon atom content is not specifically defined but is preferably at least 5%, more preferably from 5 to 30%.

The polymer (C) may have a structure having a recurring unit with a trimethylsilyl group, and having a recurring unit with a dimethylsiloxane structure-having group.

Preferred examples of the recurring unit having a functional group with a silicon atom are as follows:

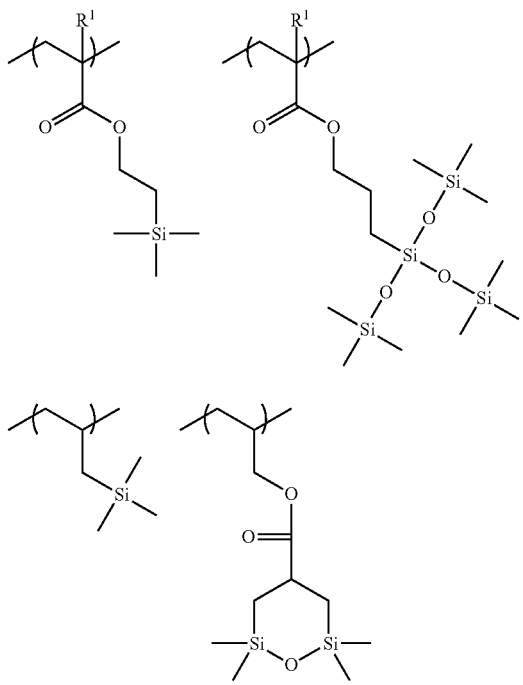

-continued

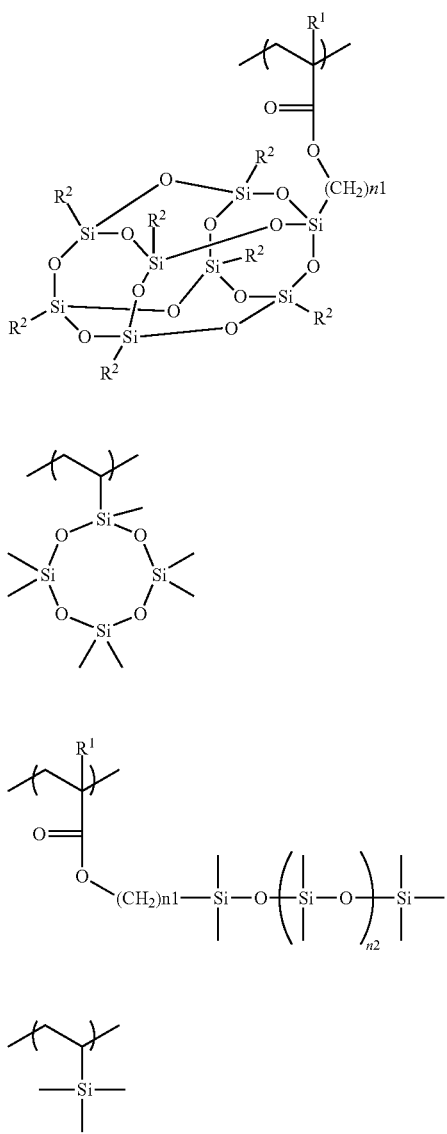

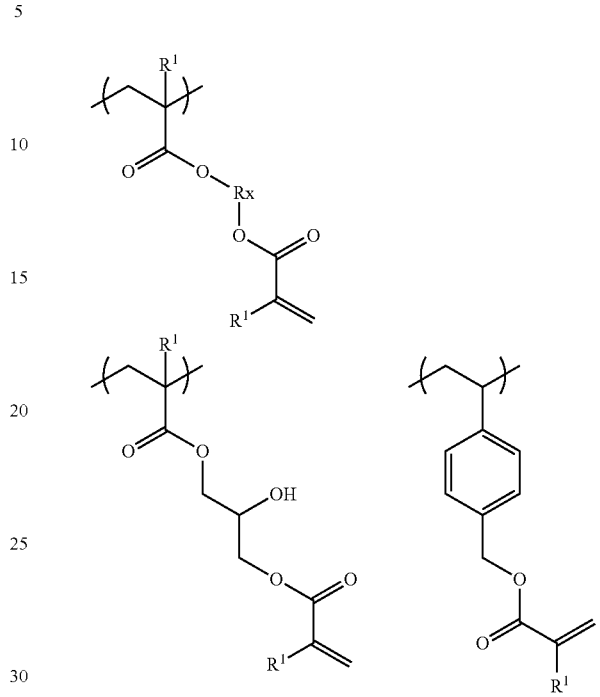

In the structure of the recurring unit having a functional group with a silicon atom, the definition and the preferred range of $R^1$ are the same as those of $R^1$ in the structure of the recurring unit having a functional group with a fluorine atom mentioned above. $R^2$ represents an alkyl group having from 1 to 8 carbon atoms, n1 indicates an integer of from 1 to 5, and n2 indicates an integer of from 1 to 100.

—Polymerizable Functional Group—

The polymer (C) has a polymerizable functional group. Having a polymerizable functional group, the polymer (C) brings about a favorable effect of reducing the adhesion of the composition to a mold.

The polymerizable functional group is preferably a cationic polymerizable functional group or a radical polymerizable functional group, more preferably a radical polymerizable functional group. Concretely, the polymerizable functional group includes a cationic polymerizable functional group such as an epoxy group, an oxetanyl group, etc.; and a radical polymerizable functional group such as (meth)acrylate group, a vinyl group, an allyl group, a styryl group, etc. Most preferred is a (meth)acrylate group.

Preferred examples of the recurring unit having a polymerizable functional group are the following:

Rx represents an alkylene group or an oxyalkylene group, preferably an ethylene group, a propylene group, a polyoxyethylene group, a polyoxypropylene group.

In the recurring unit having a polymerizable functional group, the definition and the preferred range of $R^1$ are the same as those of $R^1$ in the structure of the recurring unit having a functional group with a fluorine atom mentioned above.

—Structure of Main Chain and Side Branch of Polymer—

The polymer (C) is preferably a (meth)acrylate polymer from the viewpoint of the miscibility thereof with the other ingredients. The (meth)acrylate polymer is a polymer having at least one (meth)acrylate recurring unit, and this may contain any other recurring unit than the (meth)acrylate recurring unit.

The content of the (meth)acrylate recurring unit in the polymer (C) is preferably from 10 to 100 mol % of all the recurring units of the polymer, more preferably from 30 to 100 mol %, even more preferably from 50 to 100 mol %.

The (meth)acrylate recurring unit includes an acrylate recurring unit, a methacrylate recurring unit, and an α-substituted acrylate recurring unit (e.g., α-chloroacrylate recurring unit, α-cyanoacrylate recurring unit, α-hydroxymethylacrylate recurring unit, α-trifluoromethylacrylate recurring unit). Especially preferably, all the recurring units constituting the polymer (C) having a functional group with at least one of a fluorine atom or a silicon atom and having a polymerizable functional group are composed of an α-unsubstituted acrylate recurring unit and/or methacrylate recurring unit, since the compositional uniformity in the polymer having the constitution is better and the polymer is more effective for reducing the line edge roughness after dry etching.

One preferred embodiment of the polymer (C) has, in the side branch thereof, a recurring unit having a functional group with fluorine atom and/or silicon atom, and has, in the side branch thereof, a recurring unit having a polymerizable functional group. Specifically, the polymer having a functional group with at least one of a fluorine atom or a silicon atom and having a polymerizable functional group preferably has both the functional group with at least one of a fluorine atom or a silicon atom and the polymerizable functional group in the side branch thereof. The polymer having both the functional group with at least one of a fluorine atom or a silicon atom and the polymerizable functional group in the side branch thereof is preferred from the viewpoint of the miscibility of the polymer with the other ingredients and of the stability in producing the polymer.

Preferably, the polymer (C) contains any other recurring unit than the recurring unit having a functional group with at least one of a fluorine atom or a silicon atom and having a polymerizable functional group. In the composition for imprints of the invention, preferably, the polymer contains, as the other recurring unit, a recurring unit having, in the side branch thereof, an aromatic group and/or an acyclic alkyl group with at least 4 carbon atoms and/or a cyclic alkyl group with at least 6 carbon atoms in the side branch thereof, and a recurring unit having a polyoxyalkylene structure in the side branch thereof, from the viewpoint of the miscibility of the polymer with the other ingredients.

The preferred content of the recurring unit having a functional group with fluorine atom and/or silicon atom in the side branch thereof in the polymer (C) is from 1 to 99 mol % of all the recurring units constituting the polymer, more preferably from 5 to 80 mol %, even more preferably from 10 to 60 mol %.

The preferred content of the recurring unit having a polymerizable functional group in the side branch thereof in the polymer (C) is from 1 to 99 mol % of all the recurring units constituting the polymer, more preferably from 5 to 80 mol %, even more preferably from 10 to 50 mol %.

The preferred content of the other recurring unit than the recurring unit having a functional group with fluorine atom and/or silicon atom in the side branch thereof and the recurring unit having a polymerizable functional group in the side branch thereof in the polymer (C) is from 0 to 98 mol % of all the recurring units constituting the polymer, more preferably from 0 to 80 mol %, even more preferably from 10 to 30 mol %.

—Constitution of Polymer—

Regarding the molecular weight range of the polymer (C), the standard polystyrene-equivalent weight-average molecular weight of the polymer is at least 2000, preferably from 2000 to 300000, more preferably from 3000 to 80000, even more preferably from 5000 to 50000.

The degree of dispersion of the polymer (C) is preferably from 1.0 to 4.0, more preferably from 1.3 to 3.0, even more preferably from 1.5 to 2.5. Having a suitably controlled molecular weight and a suitably controlled degree of dispersion, the polymer is favorable, since it exhibits a sufficient mold-releasing effect even when added to the composition in a small amount and since its compatibility with the other ingredients is bettered.

—Content of Ingredient (C)—

The preferred content of the polymer (C) (ingredient (C)) in the composition is from 0.01 to 20% by mass relative to the polymerizable monomer (A), more preferably from 0.1 to 10% by mass, even more preferably from 0.3 to 8% by mass, most preferably from 0.5 to 5% by mass. In case where the polymer (C) is in the composition in an amount of from 0.01 to 20% by mass relative to the polymerizable monomer (A), it brings about favorable effects of enhancing the mold releasability of the composition and reducing the stickiness of the composition to mold not degrading the properties of the cured film.

Preferably, the polymerizable monomer (A) contains a (meth)acrylate structure in an amount of at least 80% by mass of the entire polymerizable monomer, and the polymer (C) contains a (meth)acrylate recurring unit in an amount of at least 50 mol % of all the recurring units constituting the polymer, from the viewpoint of the miscibility of the constitutive ingredients with the others.

<Other Ingredients>

The curable composition for imprints of the invention may contain, in addition to the polymerizable monomer (A), the photopolymerization initiator (B) and the polymer (C) having a functional group with at least one of a fluorine atom or a silicon atom and having a polymerizable functional group, any other ingredients such as surfactant, antioxidant, solvent, polymer ingredients and others, in accordance with various objects and not detracting from the effect of the invention. The composition for imprints of the invention preferably contains at least one elected from a nonionic surfactant and an antioxidant, more preferably a nonionic surfactant, even more preferably both a nonionic surfactant and an antioxidant from the viewpoint of the applicability thereof to substrates.

—Surfactant—

Preferably, the composition for imprints of the invention comprises a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferred are nonionic surfactants. Preferably, the composition comprises at least one of a fluorine-containing surfactant, a silicone-type surfactant and a fluorine-containing silicone-type surfactant.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431

(Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); FutagentFT250, FT251, DFX18 (Neos' trade names); Unidyne DS-401, DS-403, DS-451 (Daikin's trade names); Megafac 171, 172, 173, 178K, 178A, F780F (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the composition for imprints of the invention comprises a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab A070, A080, A0503 (by Adeka), etc. These may be used either singly or as combined.

—Polymerization Inhibitor—

Furthermore, the composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount.

In the composition for imprints of the invention, the viscosity at 25° C. of the components except the solvent is preferably from 1 to 100 mPa·s. It is more preferably from 5 to 50 mPa·s, and even more preferably from 7 to 30 mPa·s. By setting the viscosity in an appropriate range, the rectangularity of the pattern is improved, and the residual film can be inhibited to a low level.

—Solvent—

A solvent may be used for the composition for imprints of the invention, in accordance with various needs. In particular, when a pattern having a thickness of at most 500 nm is formed, the composition preferably comprises a solvent. Preferably, the solvent has a boiling point at normal pressure of from 70 to 200° C. Regarding the type of the solvent, any solvent capable of dissolving the composition may be used. Preferable examples of the solvents include solvents having an ester structure, a ketone structure, a hydroxyl group, an ether structure from the viewpoint of solubility of the composition and coatability. Preferred among them are solvents having at least any one of an ester structure, a ketone structure, a hydroxyl group and an ether structure in view of evenness of a coated thin layer. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition for imprints of the invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition, more preferably from 0 to 97% by mass. In forming a patter having a thickness of at most 500 nm, the solvent content is preferably from 30 to 99% by mass, more preferably from 70 to 97% by mass.

—Oligomer and Polymer Ingredient—

The composition for imprints of the invention may comprise a polyfunctional oligomer having a larger molecular weight than that of the above-mentioned, other polyfunctional monomer within a range capable of attaining the object of the invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The composition for imprints of the invention may comprise any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the polymer ingredient having a molecular weight of at least 2000 in the composition of the invention is at most 30% by mass of the composition except the solvent therein, then the patternability of the composition is bettered. From the viewpoint of the patternability of the composition, the resin content therein is preferably as small as possible, and except for component (C), the surfactant and other minor additives, preferably, the composition does not comprise any additional resin ingredient.

In addition to the above-mentioned ingredients, the composition for imprints of the invention may comprise, if desired, release agent, silane coupling agent, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

(Process for Preparing the Composition for Imprints)

The composition for imprints of the invention is produced by mixing the above-mentioned ingredients. After the ingredients are mixed, the resulting mixture may be filtered through a filter having a pore size of from 0.003 μm to 5.0 μm to give a solution. A filter used here preferably has a pore size of 0.1 μm or less, more preferably 0.05 μm or less. When a filter having a smaller pore size is used, undesired solid particles and patterning defect can be reduced. The ingredients may be mixed and dissolved to prepare the composition, generally at a temperature falling within a range of from 0° C. to 100° C. The filtration may be effected in plural stages, or may be repeated plural times. The solution once filtered may be again filtered. Not specifically defined, the material of the filter maybe any one, for example, polyethylene resin, polypropylene resin, fluororesin, nylon resin, etc.

[Patterning Method]

The patterning method (especially micropatterning method) of using the composition for imprints of the invention is described below. The patterning method of the invention comprises a step of applying the composition for imprints of the invention onto a substrate to form a patterning layer thereon, and a step of pressing a mold against the surface of the patterning layer.

The patterning method of the invention is favorable for a photoimprinting method. In this case, the method preferably comprises a step of applying the composition for imprints of the invention onto a substrate to form a patterning layer thereon, a step of pressing a mold against the surface of the patterning layer, a step of irradiating the patterning layer with light, and a step of releasing the mold thereby forming a micropattern on the substrate.

The photoimprint composition of the invention may be cured by heating after the irradiation with light.

Hereinafter, the patterning method using the composition for imprints of the invention (pattern transferring method) will be specifically described.

In the patterning method of the invention, the composition of the invention is first applied onto the substrate to form a patterning layer.

The method for providing the composition for imprints of the invention onto a substrate maybe a well known coating method of, for example, a dip coating method, an air knife coating method, a curtain coating method, a wire bar coating method, a gravure coating method, an extrusion coating method, a spin coating method, a slit scanning method, etc. In addition to the conventional coating methods, an inkjet method and other methods can be also used. The thickness of the patterning method of the composition of the invention may vary depending on the use thereof, and may be from 0.01 μm to 30 μm or so. The composition of the invention may be applied in a mode of multilayer coating. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched. The pattern to be formed of the composition of the invention may have good adhesiveness to the organic layer, if any, formed on the substrate.

The substrate (base or support) to which the composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate maybe light-transmissive or non-light-transmissive, depending on the combination thereof with a mold.

Next, in the patterning method of the invention, a mold is pressed against the surface of the patterning layer in order to transfer the pattern onto the patterning layer. The temperature in the mold pressing is preferably from room temperature to 80° C.

(Mold)

The mold that can be used in the patterning method of the invention will be described.

As the mold that can be used in the invention, a mold having a transferable pattern formed thereon is used. The pattern on the mold may be formed, for example, through photolithography, electronic beam lithography, or the like according to the desired processing accuracy, but in the invention, the mold patterning method is not specifically defined.

(Mold Material)

The mold material usable in the invention is described. In the photoimprint lithography with the composition of the invention, a light-transmissive material is selected for at least one of the mold material and/or the substrate. In the photoimprint lithography applied to the invention, the composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the composition for photoimprints is applied onto a light-transmissive substrate, then a mold is pressed against it, and this is irradiated with light from the back of the substrate whereby the composition for photoimprints can be cured.

Not specifically defined, the light-transmissive mold material for use in the photoimprints may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold used in the patterning method of the invention may be subjected to release treatment for the purpose of further enhancing the releasability of the composition for imprint of the invention from the surface of the mold, and of further increasing the pattern productivity. Such a release treatment of the mold includes, for example, a treatment by a silicone-based, fluorine-based, or other type of silane coupling agent. Further, for example, commercial release agents such as Optool DSX manufactured by Daikin Industries, Ltd., Novec EGC-1720 manufactured by Sumitomo 3M Limited, and the like can be very suitably used for the release treatment of the mold. As such, by using a mold that has been subjected to release treatment, and using the composition for imprints of the invention, which has a high mold releasability, a higher imprint durability of the mold can be attained.

In case where the imprint lithography is performed using the composition of the invention, the patterning method of the invention is generally preferably performed at a mold pressure of 0.1 to 30 MPa, more preferably 0.1 to 10 MPa, still more preferably 0.1 to 5 MPa, still further preferably 0.1 to 1 MPa. By setting the mold pressure at 30 MPa or less, the mold and the substrate become hard to deform and the patterning accuracy tends to increase. Furthermore, since the applied pressure is low, the device tends to be small-sized and thereby preferable. If the mold pressure is from 0.1 to 30 MPa, the residual film of the composition for imprints in the mold projections is reduced, and thus the uniformity in the mold transfer is ensured and thereby preferable.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the composition for imprints and on the tackiness of the cured film as previously determined.

In the photoimprint lithography applied to the invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the composition for imprints with mold. The system may be subjected to photoirradiation while still kept in vacuum. In the patterning method of the invention, the vacuum degree in photoirradiation is preferably from $10^{-1}$ Pa to ordinary pressure.

Light to be used for photoirradiation to cure the composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights). Light source having a wavelength of from 250 nm to 450 nm is preferably used from the viewpoint of cost of light source and throughput.

In photoexposure, the light intensity is preferably within a range of from 1 mW/cm$^2$ to 100 mW/cm$^2$. When the light intensity is at least 1 mW/cm$^2$, then the producibility may increase since the photoexposure time maybe reduced; and when the light intensity is at most 100 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photoirradiation, if desired, the cured pattern maybe further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

[Pattern]

The pattern formed according to the patterning method of the invention is useful as an etching resist or a permanent film, particularly as an etching resist. In case where the composition for imprints of the invention is used as an etching resist, a nano-order micropattern is first formed on a substrate such as a silicon wafer with a thin film of SiO$_2$ or the like formed thereon, according to the patterning method of the invention. Next, this is etched with hydrogen fluoride in wet etching, or with CF$_4$ in dry etching, thereby forming a desired pattern on the substrate. The composition for imprints of the invention exhibits especially good etching resistance in dry etching.

The pattern thus formed according to the patterning method of the invention as described in the above can be used as a permanent film (resist for structural members) for use in liquid-crystal displays (LCD) and others, or as an etching resist. After its production, the permanent film may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

[Production Examples]
(Production of Polymer (C1))

Methyl ethyl ketone (4.2 g) was put into a three-neck flask and heated at 80° C. in a nitrogen current. A solution prepared by dissolving tridecafluorooctyl methacrylate (4.5 g), 4-tert-butylcyclohexyl methacrylate (3.9 g), a compound "1" (2.0 g), and a polymerization initiator (Wako Pure Chemical's V-601) (0.48 g) in methyl ethyl ketone (38 g) was dropwise added to the above, taking 4 hours. After the addition, these were reacted at 80° C. for 3 hours to give a polymer "2". Diazabicycloundecene (3.2 g) was added to the solution, and reacted at room temperature for 10 hours. The reaction liquid was poured into water/methanol (10/90) (500 ml), and the resulting powder was collected through filtration, washed and dried to give a polymer (C1) (8.7 g). Its molecular weight was measured through GPC. The standard polystyrene-equivalent weigh-average molecular weight of the polymer was 12000, and the degree of dispersion thereof was 1.9.

(Production of Other (Meth)acrylate Polymers)

In the same manner as above, polymers (C1) to (C4) having a functional group with at least one of a fluorine atom or a silicon atom and having a polymerizable functional group and comparative polymers (X1) to (X4) mentioned below were produced. In the following structures, the ratio of the recurring units is by mol.

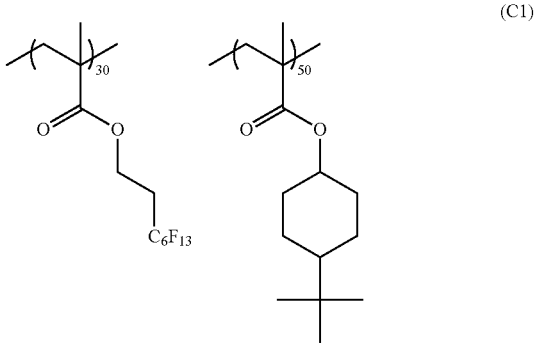

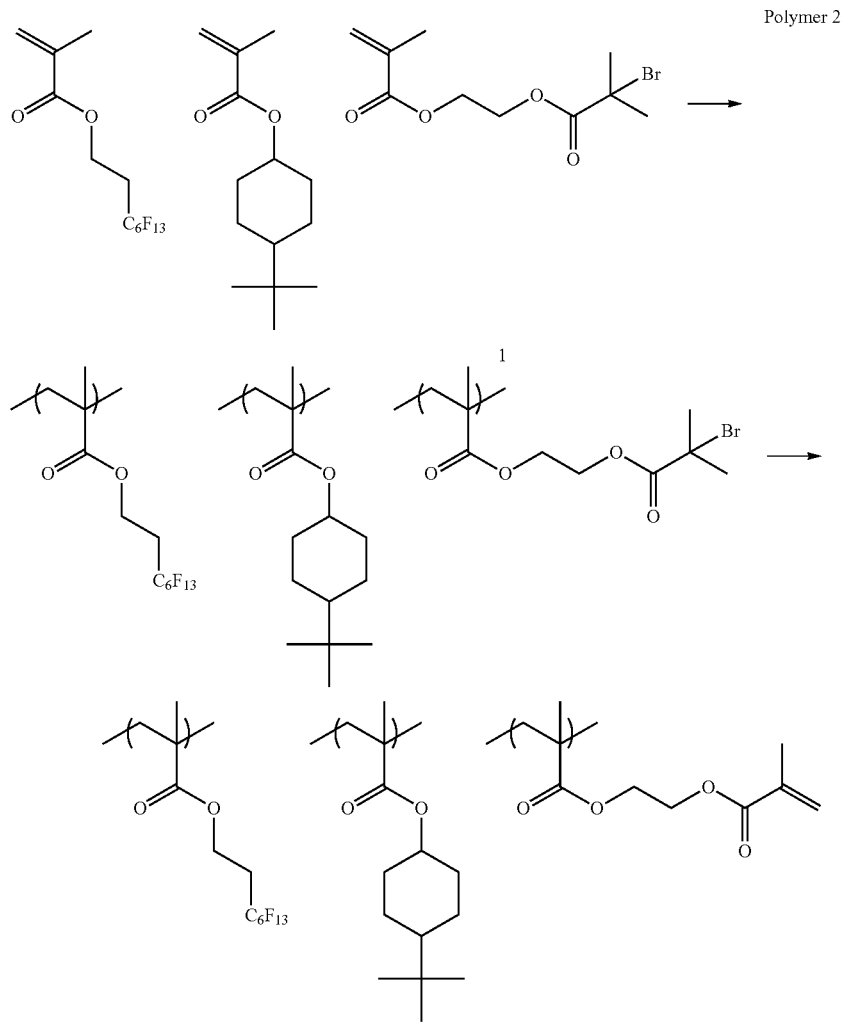

-continued
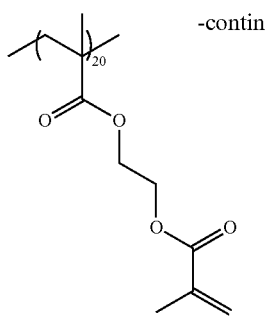
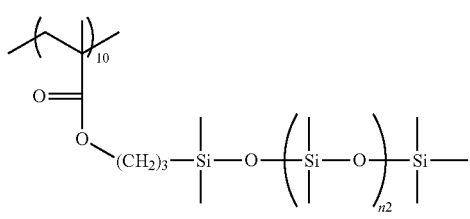
mixture with n2 being 9 on average
(C2)
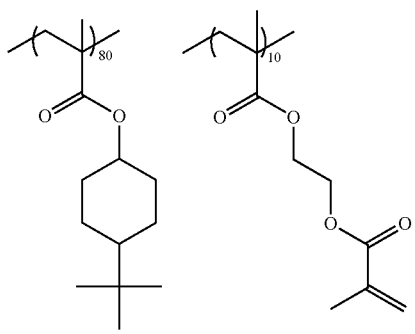
(C3)
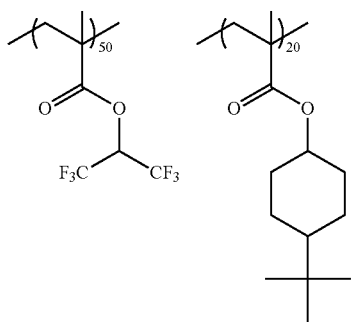
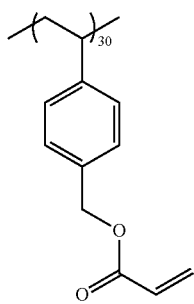
-continued
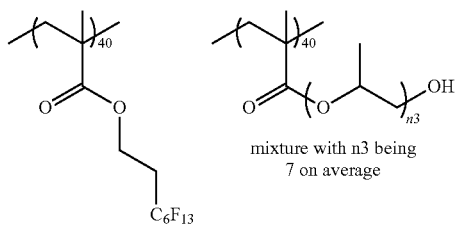
mixture with n3 being 7 on average
(C4)
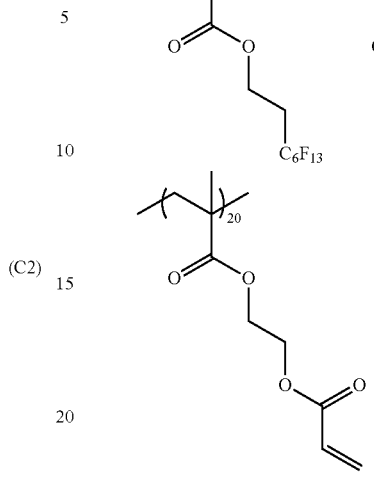
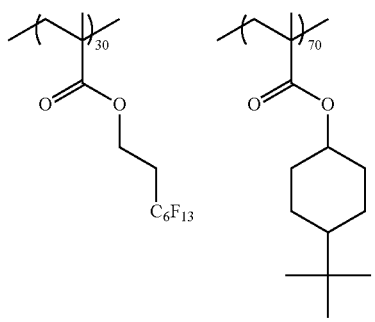
(XI)
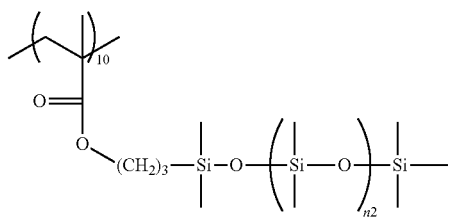
mixture with n2 being 9 on average
(X2)
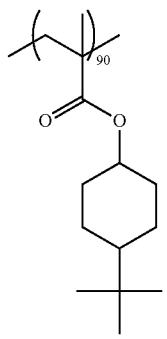
(X3)

-continued

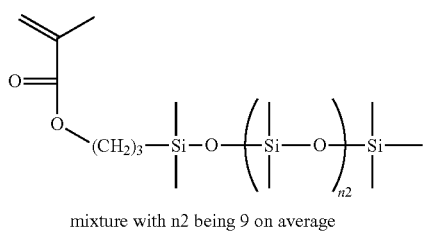
(X4)

mixture with n2 being 9 on average

The molecular weight and the degree of dispersion of the obtained polymers are shown in Table 1. The molecular weight and the degree of dispersion were determined through GPC, computed as the standard polystyrene-equivalent values.

Examples 1 to 7, Comparative Examples 1 to 5

<Photoimprinting Method>

A polymerization initiator P1 (2% by mass) and a polymer ingredient (1% by mass) of polymers (C1) to (C4) having a functional group with at least one of a fluorine atom or a silicon atom and having a polymerizable functional group or polymers (X1) and (X1) or low-molecular-weight polymerizable compounds (X3) and (X4) having a fluorine atom or a silicon atom were added to the polymerizable monomer as in Table 1 shown below, thereby producing photoimprint compositions.
(Polymerizable Monomer)
R1: benzyl acrylate
R2: neopentylglycol diacrylate
R3: trimethylolpropane triacrylate
R4: urethane acrylate (Gohselac UV7500B, by Nippon Gohsei)
R5: m-xylylene diacrylate
R6: 1-naphthylmethyl acrylate
(Polymerization Initiator)
P1: 2,4,6-trimethylbenzoyl ethoxyphenyl phosphine oxide (Lucirin TPO-L, by BASF)
<Mold Releasability 1>

The obtained composition (10 μl) was put on a slide glass, and, as a patternless mold, a slide glass fluorocoated with a fluoroalkyl group-having silane coupling agent on the surface thereof was put onto it, thereby making the composition uniformly spread between the slide glass and the mold.

This was irradiated with light containing 365-nm UV ray at a dose of 240 mJ/cm$^2$ in a nitrogen atmosphere to thereby cure the composition. The mold was peeled from the slide glass, and the cured film remained on the slide glass. Using the same mold but changing the composition on the slide glass, this operation was repeated 25 times. The surface of the resulting mold was analyzed to confirm, if any, the peeling of the fluorocoating from the mold and the adhesion of the composition to the mold.
A: No peeling of fluorocoating from mold.
B: Fluorocoating peeled from mold.
a: No adhesion of composition to mold.
b: Composition adhered to mold.
<Patternability, Mold Releasability 2>

The obtained composition (10 μl) was put on a silicon substrate, and a quartz mold having a rectangular line/space pattern (1/1) with a line width of 100 nm and a groove depth of 100 nm and fluoro-processed on the pattern surface was put onto it, and set in an imprinting apparatus. The apparatus was degassed to be in vacuum and then purged with nitrogen (nitrogen purging). The mold was pressed against the substrate under a pressure of 1 MPa at 25° C., and this was exposed to light from the back of the mold at a dose of 240 mJ/cm$^2$. After the exposure, the mold was removed and a pattern was formed on the substrate. Using the same mold but changing the composition on the silicon substrate, this operation was repeated 25 times. The pattern formed on the 25th transferring operation was observed with a scanning microscope. In addition, the mold used in patterning was checked for the composition, if any, adhering thereto, using a scanning electronic microscope and an optical microscope, thereby evaluating the mold releasability of the composition.
<Patternability>
A: Pattern faithful to mold was formed with no line pattern defect.
B: Line pattern partly lost.
<Mold Releasability 2>
A: No adhesion of curable composition to mold at all.
B: Some but slight adhesion of curable composition to mold.
C: Definite adhesion of curable composition to mold.

TABLE 1

| | Polymerizable Monomer (ratio, % by mass) | | | Polymer Ingredient | | | Mold Releasability 1 | | | |
|---|---|---|---|---|---|---|---|---|---|---|
| | | | | type | weight-average molecular weight | degree of dispersion | peeling of fluorocoating from mold | adhesion of composition to mold | Patternability | Mold Releasability 2 |
| Example 1 | R1(50) | R2(50) | | (C1) | 12000 | 1.9 | A | a | A | A |
| Example 2 | R1(50) | R2(50) | | (C2) | 20000 | 2.2 | A | a | A | A |
| Example 3 | R1(50) | R2(20) | R3(20) | (C1) | 12000 | 1.9 | A | a | A | A |
| Example 4 | R2(95) | R4(5) | | (C2) | 20000 | 2.2 | A | a | A | A |
| Example 5 | R1(40) | R6(60) | | (C1) | 12000 | 1.9 | A | a | A | A |
| Example 6 | R3(10) | R5(40) | R6(50) | (C3) | 9800 | 1.9 | A | a | A | A |
| Example 7 | R1(20) | R5(30) | R6(50) | (C4) | 31000 | 2.4 | A | a | A | A |
| Comparative Example 1 | R1(50) | R2(50) | | no | — | — | B | b | B | C |
| Comparative Example 2 | R1(50) | R2(50) | | (X1) | 12000 | 1.85 | A | b | A | B |
| Comparative Example 3 | R1(50) | R2(50) | | (X2) | 21000 | 2.2 | A | b | A | B |
| Comparative Example 4 | R1(50) | R2(50) | | (X3) | 1000 | 1.3 | B | b | B | C |
| Comparative Example 5 | R1(50) | R2(50) | | (X4) | 418 | 1 | B | b | B | C |

From Table 1, it is known that the compositions of Examples 1 to 7 of the invention are excellent in mold releasability, remain little on the mold in repeated patterning operation and have good patternability, as compared with the compositions of Comparative Examples. On the other hand, in Comparative Example 1 in which no polymer ingredient was added to the composition, the fluorocoating peeled away from the mold, the composition adhered to the mold, and the patternability of the composition was bad. In Comparative Examples 2 and 3 where comparative polymers (X1) and (X2) with no polymerizable group were used, the composition adhered to the mold both in patterning with a patternless mold and in patterning with a patterned mold. In Comparative Examples 4 and 5 where comparative polymers (X3) and (X4) having a similar structure as that of the ingredient (C) but having a molecular weight of less than 2000 were used, the mold releasability and the patternability of the compositions were bad and the compositions adhered to the mold.

The invention claimed is:

1. A composition for imprints comprising:
   a polymerizable monomer,
   a photopolymerization initiator, and
   a polymer having a functional group with at least one of a fluorine atom and a silicon atom and having a polymerizable functional group, wherein the polymer has a weight-average molecular weight of at least 2000 and the amount of the polymer is from 0.01 to 20% by mass relative to the total amount of the polymerizable monomer,
   wherein the composition comprises an unsaturated monomer having one ethylenic unsaturated bond-having group in an amount of at least 15% by mass relative to the total amount of the polymerizable monomers; and
   an amount of polymerizable monomers having at least one kind of an urethane group, a hydroxyl group and an amide group in the composition for imprints is at most 20% by mass of all the polymerizable monomers.

2. The composition for imprints according to claim 1, wherein the polymer has both the functional group with at least one of a fluorine atom and a silicon atom and the polymerizable functional group in a side branch of the polymer.

3. The composition for imprints according to claim 1, wherein the functional group with at least one of a fluorine atom and a silicon atom has at least one structure selected from the group consisting of a trifluoromethyl group, a trimethylsilyl group and a dimethylsiloxane structure-having group.

4. The composition for imprints according to claim 1, wherein the polymer has a recurring unit represented by the following formula (Ca):

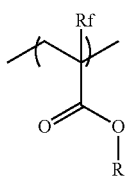

(Ca)

wherein Rf represents a functional group having at least one trifluoromethyl group and R represents a hydrogen atom or an organic group.

5. The composition for imprints according to claim 1, wherein the polymer has a recurring unit represented by one of the following formulae:

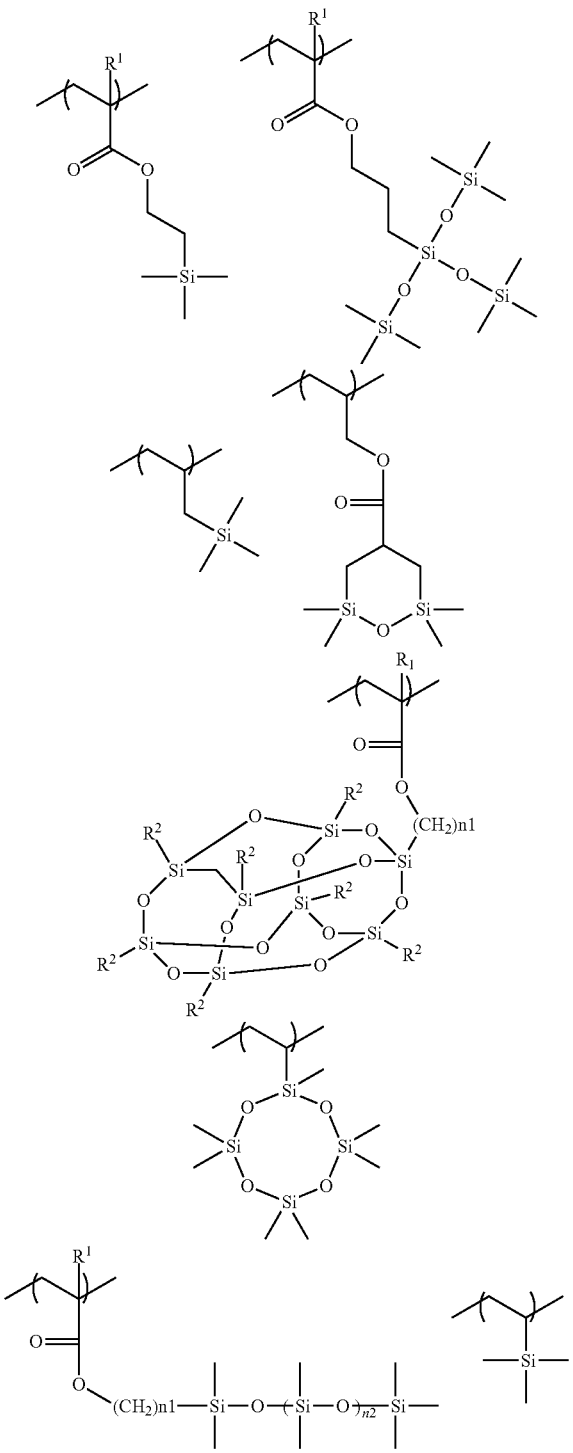

wherein $R^1$ represents a hydrogen atom, a halogen atom, a methyl group or a cyano group, $R^2$ represents an alkyl group having from 1 to 8 carbon atoms, n1 indicates an integer of from 1 to 5, and n2 indicates an integer of from 1 to 100.

6. The composition for imprints according to claim 1, wherein the polymerizable functional group is a (meth)acrylate group.

7. The composition for imprints according to claim 1, wherein the polymer is a (meth)acrylate polymer.

8. The composition for imprints according to claim 1, wherein the polymer has, in a side branch thereof, a recurring unit having an aromatic group, an acyclic alkyl group having at least 4 carbon atoms or a cyclic alkyl group having at least 6 carbon atoms.

9. The composition for imprints according to claim 1, wherein the polymer has a degree of dispersion of from 1.0 to 4.0.

10. The composition for imprints according to claim 1, wherein the polymerizable monomer has a (meth)acrylate structure having an aromatic group, an acyclic alkyl group having at least 4 carbon atoms or a cyclic alkyl group having at least 6 carbon atoms.

11. The composition for imprints according to claim 1, which further comprises a solvent.

12. The composition for imprints according to claim 11, wherein the solvent has at least one selected from the group consisting of an ester group, an ether group, a carbonyl group and a hydroxyl group.

13. The composition for imprints according to claim 1, which further comprises a nonionic surfactant.

14. The composition for imprints according to claim 1, wherein the polymer has a recurring unit represented by the following formula (Cb):

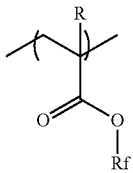

(Cb)

wherein Rf represents a functional group having at least one trifluoromethyl group and R represents a hydrogen atom or an organic group.

15. The composition for imprints according to claim 1, wherein the polymer has a recurring unit represented by the following formula (Cc):

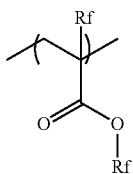

(Cc)

wherein Rf represents a functional group having at least one trifluoromethyl group and R represents a hydrogen atom or an organic group.

16. The composition for imprints according to claim 1, wherein the polymer has a recurring unit represented by the following formula (Cd):

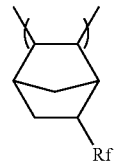

(Cd)

wherein Rf represents a functional group having at least one trifluoromethyl group.

17. The composition for imprints according to claim 1, wherein the polymer has a recurring unit represented by the following formula (Ce):

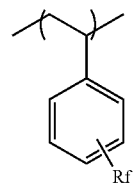

(Ce)

wherein Rf represents a functional group having at least one trifluoromethyl group.

18. The composition for imprints according to claim 1, wherein the polymer has a recurring unit represented by the following formula (Cf):

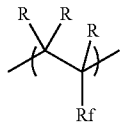

(Cf)

wherein Rf represents a functional group having at least one trifluoromethyl group and R represents a hydrogen atom or an organic group.

19. The composition for imprints according to claim 1, wherein the polymer having a functional group with at least one of a fluorine atom and a silicon atom and having a polymerizable functional group has 10 to 60 mol% of a recurring unit having a functional group with fluorine atom and/or silicon atom in a side branch thereof, 10 to 50 mol % of a recurring unit having a polymerizable functional group in a side branch thereof, and 10 to 80 mole % of a recurring unit having at least one kind of an aromatic group, an acyclic alkyl group with at least 4 carbon atoms, a cyclic alkyl group with at least 6 carbon atoms, and a polyoxyalkylene structure in a side branch thereof.

20. A patterning method comprising:
applying the composition for imprints of claim 1 onto a substrate to form a patterning layer thereon, and
pressing a mold against the surface of the patterning layer.

21. A pattern formed according to the patterning method of claim 20.

* * * * *